United States Patent [19]

Konstad

[11] Patent Number: 5,707,247
[45] Date of Patent: Jan. 13, 1998

[54] LOW-PROFILE ZERO-INSERTION FORCE SOCKET

[75] Inventor: Rolf A. Konstad, Gold River, Calif.

[73] Assignee: Intel Corporation, Santa Clara, Calif.

[21] Appl. No.: 542,425

[22] Filed: Oct. 12, 1995

[51] Int. Cl.⁶ ............................................. H01R 4/50
[52] U.S. Cl. ............................................. 439/342
[58] Field of Search .......................... 439/342, 259, 439/260, 261, 266, 265, 268, 331, 73

[56] References Cited

U.S. PATENT DOCUMENTS

| | | | |
|---|---|---|---|
| 3,676,832 | 7/1972 | Judge et al. | 439/342 |
| 4,322,119 | 3/1982 | Baker . | |
| 4,420,205 | 12/1983 | Kirkman | 439/342 |
| 4,498,725 | 2/1985 | Bright et al. | 439/342 |
| 4,538,870 | 9/1985 | Thewlis | 439/342 |
| 4,773,873 | 9/1988 | Hillis | 439/260 |
| 4,950,980 | 8/1990 | Pfaff | 439/342 |
| 5,384,692 | 1/1995 | Jaff | 361/807 |

OTHER PUBLICATIONS

"Single Level (SL) ZIF Sockets for Intel Pentium™ Processors", AMP Incorporated, Mar. 1994.

*Primary Examiner*—Hien Vu
*Attorney, Agent, or Firm*—Blakely, Sokoloff, Taylor & Zafman

[57] ABSTRACT

A low-profile zero-insertion socket includes a plurality of resilient contacts mounted directly into the motherboard. The socket has a support plate slidingly attached to the motherboard and including a plurality of through apertures formed to receive the pins of a microprocessor package. A low-profile eccentric cam actuator, rotationally coupled to the motherboard, is provided for moving the support plate that bears the microprocessor to and from a position where the microprocessor pins engage the resilient contacts.

26 Claims, 14 Drawing Sheets

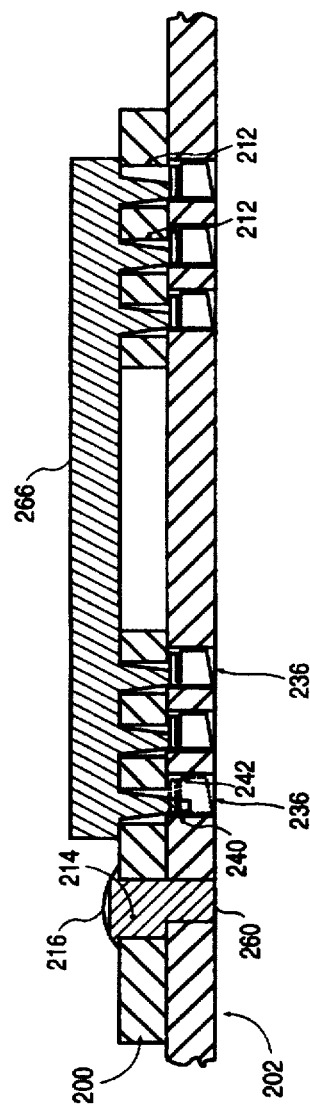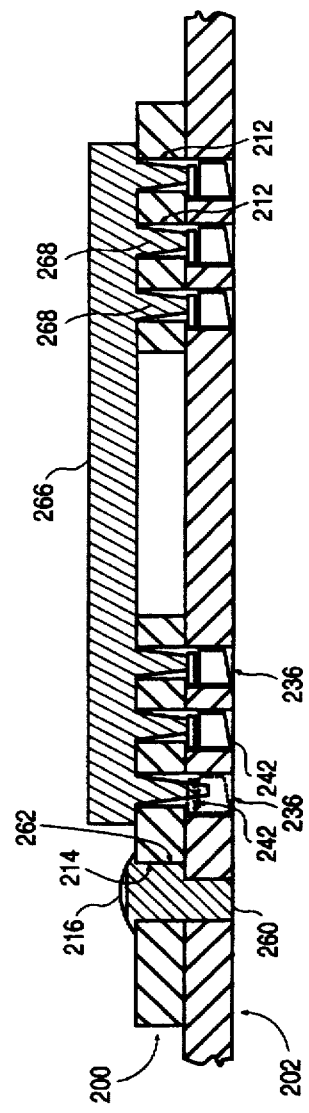

LOW-PROFILE ZERO-INSERTION FORCE SOCKET

BACKGROUND OF THE INVENTION

1. Field of the Invention

The present invention relates to the field of electrical connectors, particularly to sockets for attaching integrated-circuit packages to a printed-circuit board.

2. Description of Related Art

Typically, electrical connectors having various configurations are employed for attaching integrated-circuit (IC) modules to printed-circuit (PC) boards. Such connectors provide additional versatility to computer platforms by allowing major components, such as microprocessors, to be easily removed and replaced with upgraded units. For example, one type of connector that is used for such a purpose is the low-insertion-force (LIF) socket which comprises an insulative body including a plurality of small openings. Each of these openings houses a spring contact having a tail portion that extends through the insulative body of the socket and is soldered to the PC-board circuitry. The IC module is attached to the PC board by plugging the former into the LIF socket. As the terminals (pins) of the IC module are inserted into the openings of the LIF socket, the spring contacts located in the openings expand or deflect. The frictional interconnection thus created between the pins of the IC module and the spring contacts of the LIF socket electrically and physically couples the IC module to the PC board.

One drawback associated with known LIF sockets is a high insertion force required to plug an IC module therein. As a result, the delicate terminals of the IC module can be damaged during their insertion into the corresponding openings of a LIF socket. Furthermore, IC modules having a large number of terminals (e.g., over three hundred pins) would require insertion forces exceeding the integrity of the PC-board assembly if a LIF socket were to be employed for coupling the IC module to the PC board.

To overcome these deficiencies, zero-insertion-force (ZIF) sockets have been developed and are commonly utilized in the industry. As shown in FIG. 1, a known ZIF socket includes a top plate 100 that is slidingly attached to a base 102. Top plate 100 has a plurality of through apertures 104. Base 102 contains a corresponding plurality of openings 106, housing spring elements 108, each of which has a tail portion 110. Tail portions 110 protrude through a plurality of corresponding openings formed in the motherboard (not shown) and are soldered to the motherboard circuitry. A conventional ZIF socket further includes a camshaft 114, located inside a raised portion 116 of top plate 100. Rotating a lever 118 causes camshaft 114 to act on base 102, displacing top plate 100 with respect to base 102, which is anchored to the motherboard via tail portions 110.

When an IC module (not shown), such as a microprocessor, is inserted into an open ZIF socket, the pins of the IC module protrude through apertures 104 of top plate 100. With the socket in its open position, apertures 104 and corresponding spring elements 108 are not aligned, so that no contact exists between the pins of the IC module and spring elements 108. As lever 118 is rotated downwards, camshaft 114 exerts a force on base 102, causing top plate 100 to translate relative to base 102, such that the pins of the IC module and spring elements 108 align and engage.

Even though a conventional ZIF socket is an improvement over LIF sockets, it has a number of flaws. For example, high impedance of tail portions 110 impairs the electrical performance of known ZIF sockets. Impedance is generally defined as the total opposition of a circuit to the flow of alternating or any other varying current at a particular frequency. It is commonly known in the art that the less material is available for conduction, the higher the impedance of that conductor. At high frequencies, impedance becomes the limiting factor for electrical performance of a conductor having a small surface area because at such frequencies current travels along the surface of the conductor instead of flowing through its core. Accordingly, electrical performance of conventional ZIF sockets suffers due to a combination of a relatively small surface area of tail portions 110 and high operating frequencies of microprocessors requiring the use of ZIF sockets. Thus, socket inductance becomes the limiting parameter in applications where a high-frequency bus is used between a socket-mounted microprocessor and board-mounted components, such as a cache memory.

Moreover, the configuration of conventional ZIF sockets is often the source of packaging and layout problems. Along with the microprocessor, a computer motherboard also bears a plurality of expansion cards comprising circuits that enhance the power and versatility of the computer system. Due to the high profile of a conventional ZIF socket compounded with the necessity to "piggyback" large heat sinks onto microprocessors that continuously grow more powerful and correspondingly generate more heat, it often becomes impossible to position the microprocessor on the motherboard so that it clears the bottom edges of uprightly-mounted full-size expansion cards. This leads to expansion-card slot loss, whereby the motherboard has insufficient space for attaching all the desirable expansion cards because of a bulky microprocessor assembly.

In an attempt to reduce expansion-card slot loss, low-profile oversize heat sinks are occasionally utilized in the art. Such heat sinks often have a greater planar area than the ZIF socket. Consequently, if the geometry of the heat sink is such that lever 118 of the ZIF socket (FIG. 1) does not clear the heat sink when the socket is in its open position, the microprocessor cannot be coupled to or removed from the motherboard without detaching the heat sink first. Unfortunately, detaching the heat sink is not always a viable alternative since it is often desirable to permanently bond the heat sink to the microprocessor. Thus, the use of a conventional ZIF socket limits the number of available heat-sink geometries and orientations.

Furthermore, with the advent of mobile computing, it has become increasingly important to provide downsized computer platforms where major components, such as microprocessors, can be easily upgraded. However, due to space constraints, a conventional ZIF socket having a high-profile construction and bulky lever mechanism is not suitable for use in applications involving portable computers.

SUMMARY OF THE INVENTION

It is accordingly desirable to provide a low-profile ZIF socket that overcomes the foregoing drawbacks, e.g., that possesses a low impedance and hence delivers superior electrical performance in high-frequency digital-signal applications, minimizes expansion-card slot loss, enables removal of the microprocessor without detaching its heat sink, allows for a variety of heat-sink geometries and orientations, and can be employed in portable-computer applications.

Further advantages of the invention will become apparent after consideration of the ensuing description and the accompanying drawings.

In one particular embodiment, the low-profile ZIF socket of the present invention includes a plurality of resilient contacts located directly in the motherboard. The low-profile ZIF socket further includes a non-conductive support plate having a plurality of through openings formed to receive the pins of a microprocessor package. The support plate of the low-profile ZIF socket is slidingly attached to the motherboard and is positioned above the resilient contacts. A vertical eccentric cam actuator is provided in the motherboard for moving the support plate that bears the microprocessor to and from a position where the microprocessor pins engage the resilient contacts located in the motherboard.

BRIEF DESCRIPTION OF THE DRAWINGS

The present invention is illustrated by way of example, and not by way of limitation, in the figures of the accompanying drawings, where:

FIG. 8 is a sectional view of the low-profile ZIF socket of FIG. 2 in an unlatched position.

FIG. 9 is a sectional view of the low-profile ZIF socket of FIG. 2 in a latched position.

For purposes of illustration, these figures are not necessarily drawn to scale. In all of the figures, like components are designated by like reference numerals.

DETAILED DESCRIPTION OF THE INVENTION

Throughout the following description, specific details are set forth in order to provide a more thorough understanding of the invention. However, the invention may be practiced without these particulars. In other instances, well known elements have not been shown or described to avoid unnecessarily obscuring the present invention. 5 Accordingly, the specification and drawings are to be regarded in an illustrative, rather than a restrictive, sense.

Figure 1:
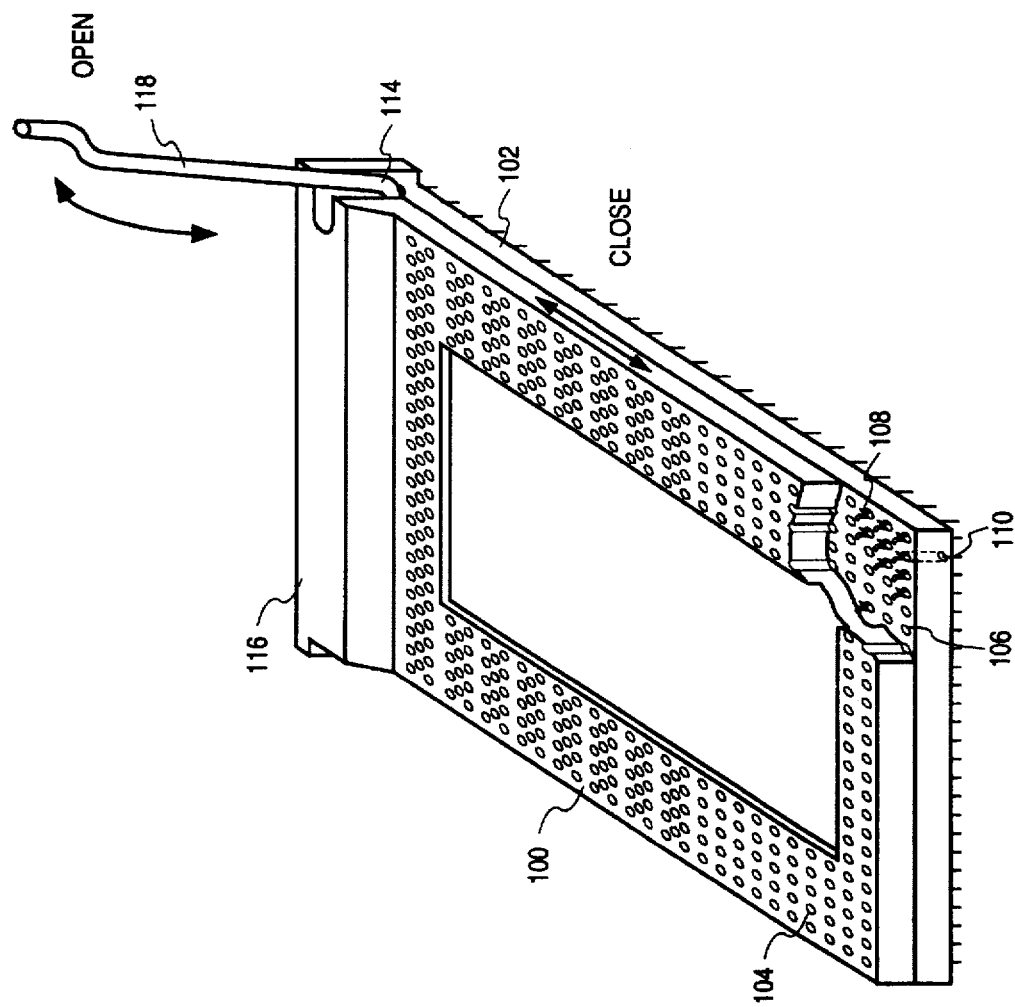
FIG. 1 is a perspective, partially-sectional view of a known ZIF socket.
Figure 2:
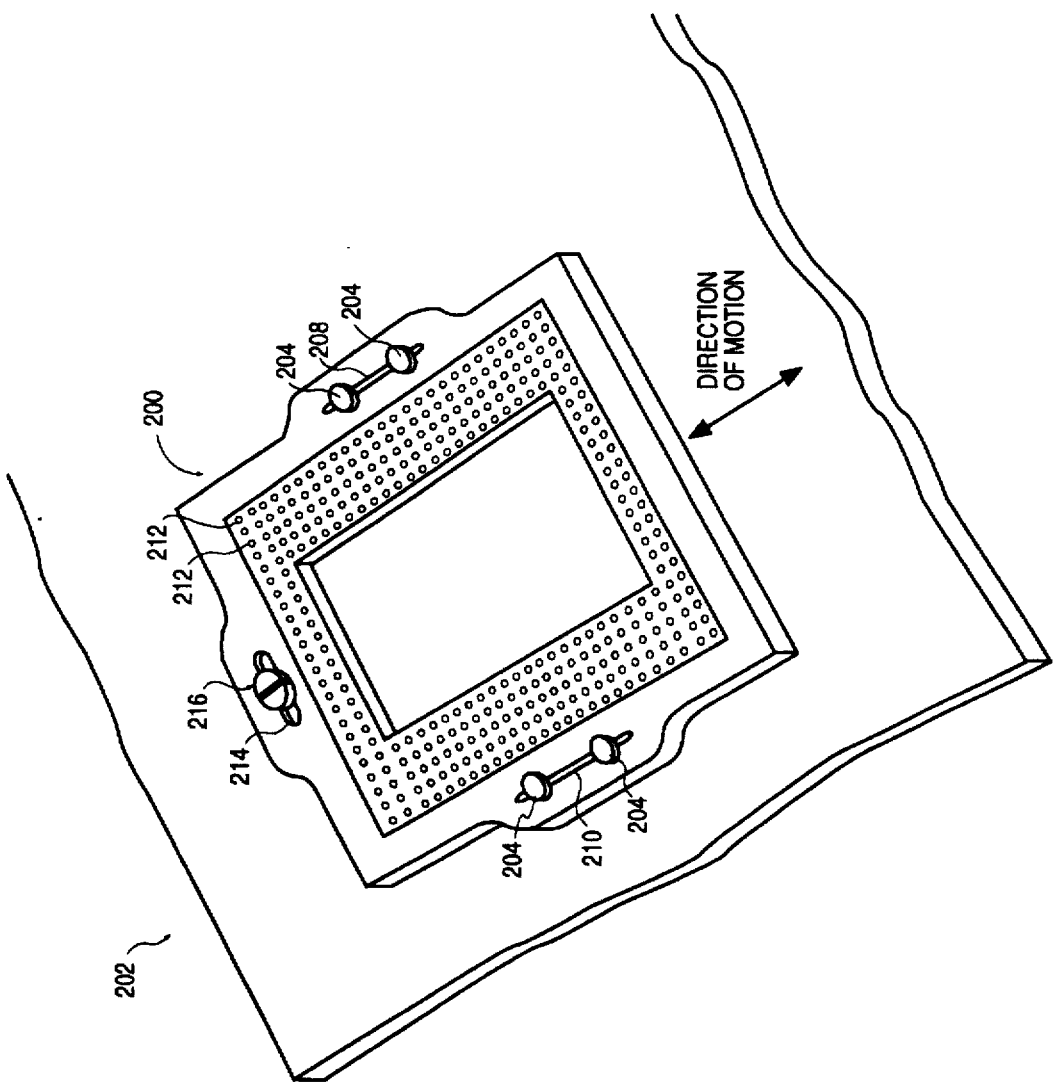
FIG. 2 is a perspective view of a low-profile ZIF socket according to one embodiment of the present invention.

FIG. 2 is a perspective view of a low-profile ZIF socket according to one embodiment of the present invention. The socket includes a non-conductive support plate 200, movably attached to a PC board (e.g., a motherboard) 202 with fasteners 204. The direction of motion of support plate 200 with respect to PC board 202 is defined by parallel longitudinal slots 208 and 210, engaging fasteners 204. Support plate 200 has a plurality of through apertures 212 formed to receive terminals of a microprocessor (not shown). Support plate 200 further includes a transverse slot 214, engaging a vertical eccentric cam actuator 216 that is rotationally coupled to PC board 202.

Figure 3:
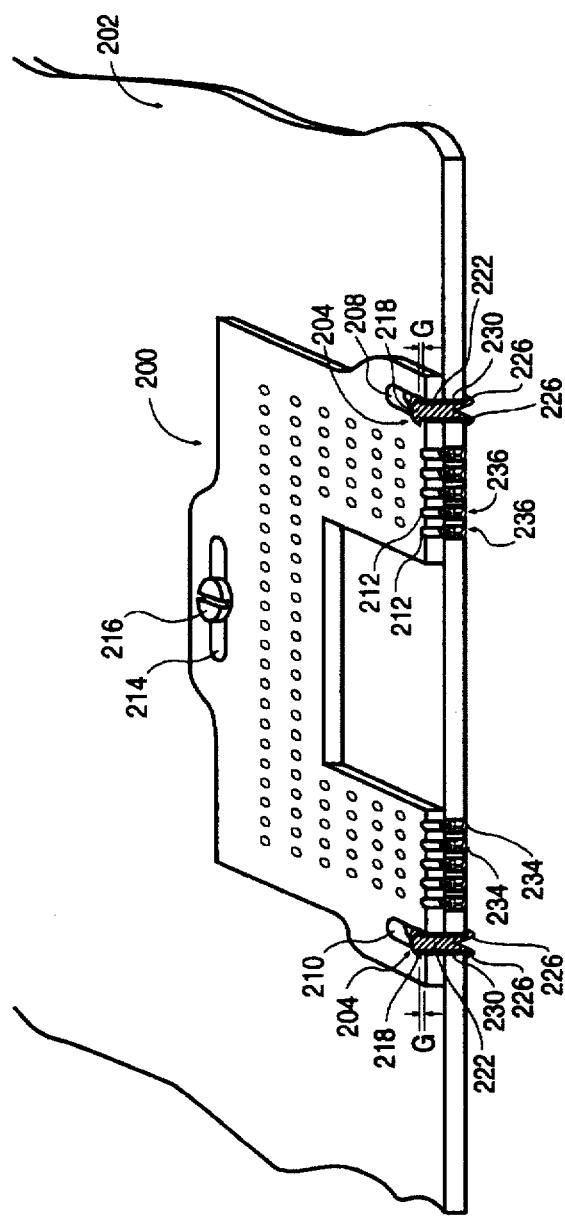
FIG. 3 is a perspective sectional view of the low-profile ZIF socket of FIG. 2.

As shown in FIG. 3, fasteners 204 may comprise a wide variety of known fastener types, e.g., plastic snap-in rivets, having heads 218, shanks 222, and locking slotted legs 226. Fasteners 204 are locked in corresponding openings 230, formed in PC board 202. Gaps G are provided between the top surface of plate 200 and the bottom surfaces of heads 218. Consequently, the "gripping length" of fasteners 204 is slightly greater than the combined thicknesses of support plate 200 and PC board 202, thereby allowing plate 200 to move freely with respect to PC board 202 in the direction defined by slots 208 and 210. PC board 202 includes a plurality of through openings 234, corresponding to apertures 212 but having larger bores than the latter. Openings 234 house resilient contacts 236, made of a conductive metal, e.g., a copper alloy.

Figure 4:
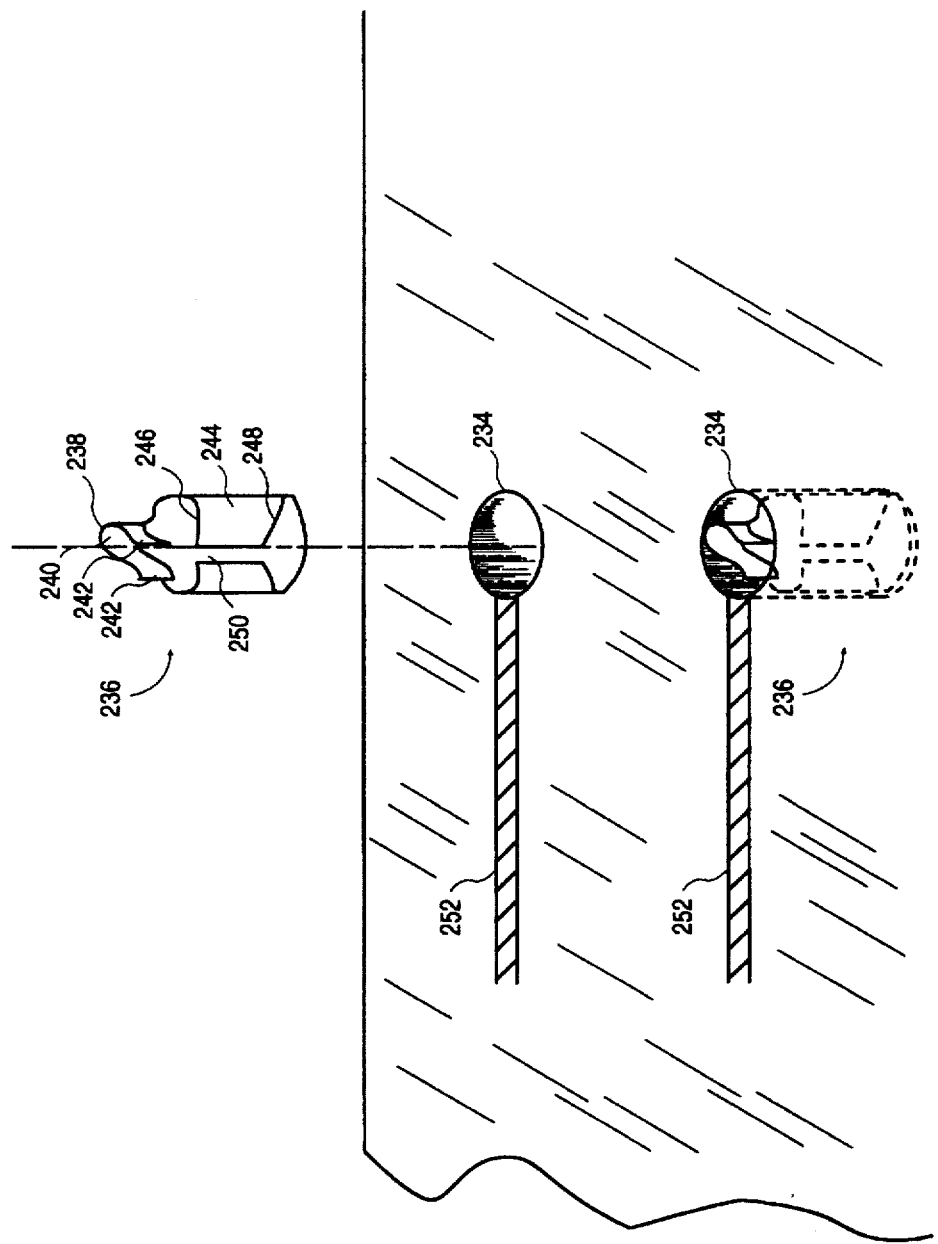
FIG. 4 is a perspective view of resilient contacts employed in the low-profile ZIF socket of FIG. 2.

FIG. 4 illustrates the geometry and the mounting method of contacts 236 into openings 234. The overall height of contacts 236 is less than the thickness of PC board 202. Each contact 236 includes a gold-over-nickel plated contact head 238, having an entrance opening 240 and a pair of venturi-shaped contact elements 242. Furthermore, each contact 236 possesses a downwardly-tapered cylindrical contact body 244, having a shoulder portion 246 and a skirt portion 248. The diameter of shoulder portion 246 is slightly greater than that of openings 234 whereas, due to the taper of contact body 244, the diameter of skirt portion 248 is less than that of openings 234 to facilitate insertion of contacts 236 into corresponding openings 234. Each contact body 244 also includes a vertical slot 250, formed to provide spring action of the contact body. In combination with shoulder portion 246, that has a larger diameter than openings 234, the spring action delivered by slot 250 allows contacts 236 to be temporarily anchored in corresponding openings 234 before they are permanently attached to the PC board 202 by fellow soldering. The large surface area of contact bodies 244 delivers reduced impedance of contacts 236 at high digital-signal frequencies, thereby improving electrical performance of the ZIF socket. Furthermore, mounting contacts 236 directly into the PC board lowers the profile of the ZIF socket, thus helping to decrease expansion-card slot loss.

The inner surfaces of openings 234 and the outer surfaces of contact bodies 244 are reflow-soldered together to securely attach contacts 236 to PC board 202 as well as to provide positive electrical connections between contacts 236 and PC board circuitry, e.g., circuit traces 252 terminating in corresponding openings 234. Reflow soldering is a process that comprises the steps of depositing solder (an alloy having a low melting point) on the parts to be joined, applying heat to the surfaces containing the deposition to melt the solder, and allowing the solder to resolidify and form a solder joint. Once contact bodies 244 are reflow-soldered into openings 234, contacts 236 become permanently attached to PC board 202 and are electrically coupled thereto, enabling high-frequency digital signals to flow between circuit traces 252 and contacts 236.

Figure 5:
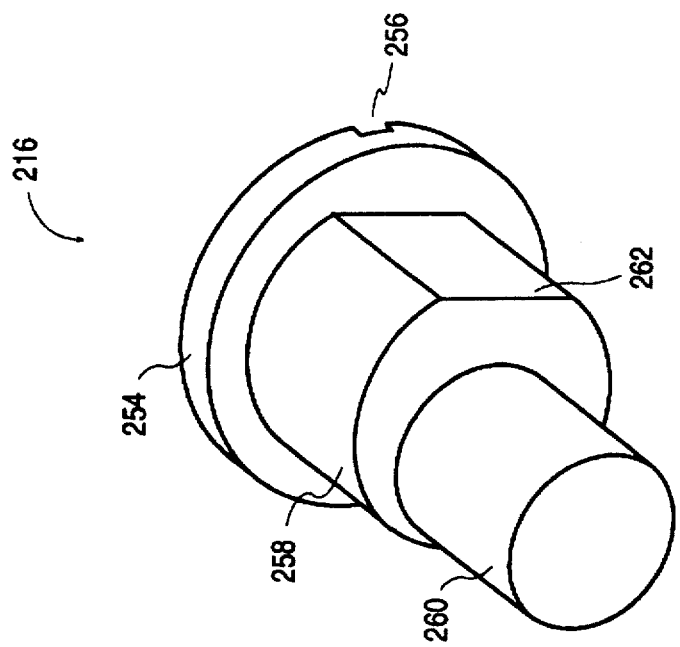
FIG. 5 is a perspective view of a vertical eccentric cam actuator of the low-profile ZIF socket of FIG. 2.
Figure 6:
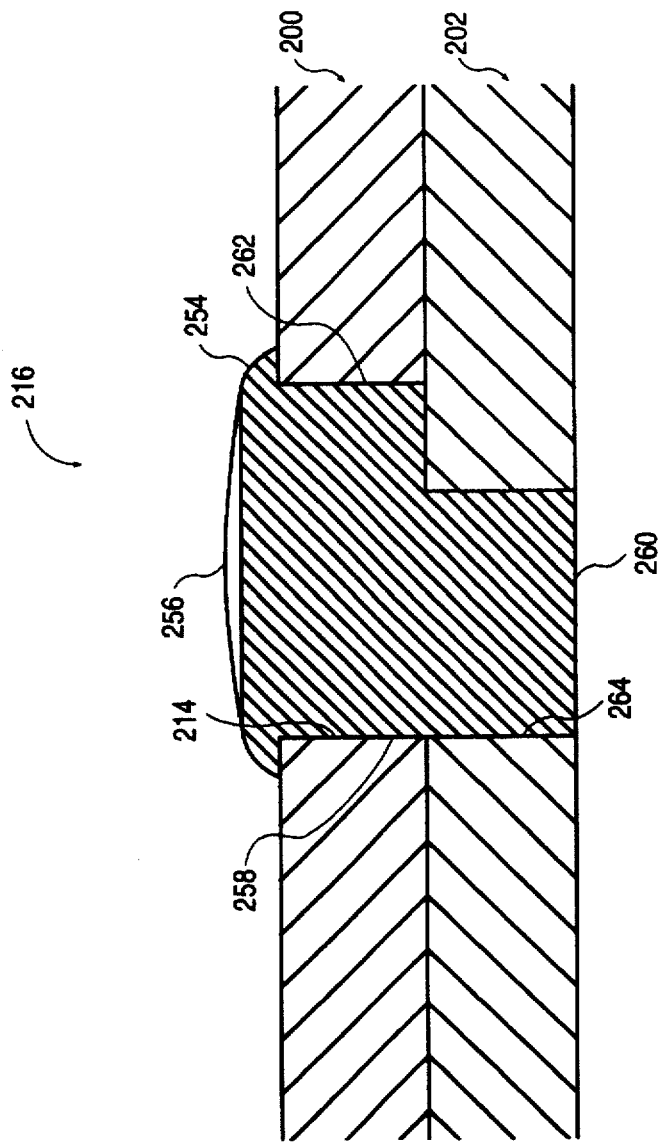
FIG. 6 is a sectional view of the vertical eccentric cam actuator of FIG. 5.
Figure 7:
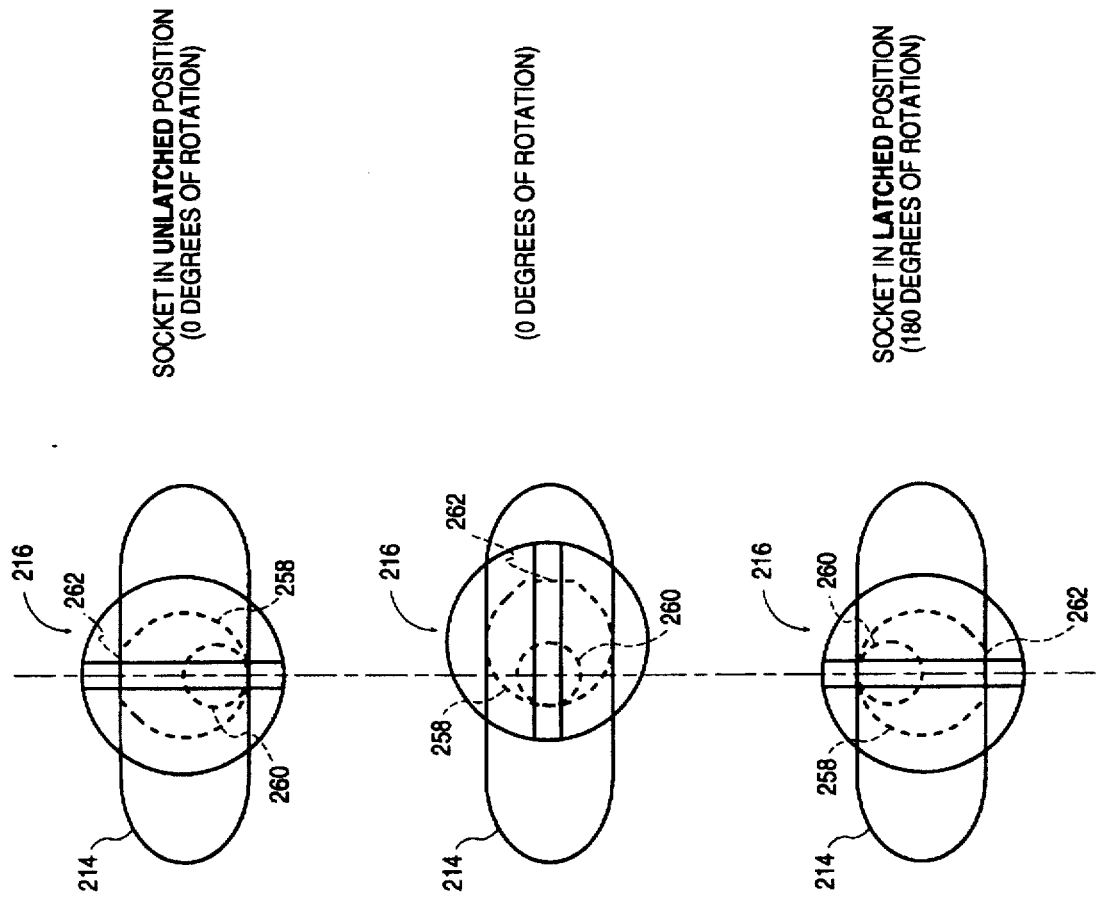
FIG. 7 is a top view of the vertical eccentric cam actuator of FIG. 5 in various orientations.

Eccentric actuator 216 of the low-profile ZIF socket according to one embodiment of the present invention is depicted in FIG. 5. Actuator 216 comprises a head portion 254 having a slot 256, a cylindrical body portion 258, concentric with head portion 254, and a cylindrical tail portion 260, eccentric with respect to body portion 258. Body portion 258 further includes a detent, e.g., a flat 262. As shown in FIG. 6, body portion 258 of eccentric actuator 216 engages transverse slot 214 of support plate 200, whereas tail portion 260 engages a circular opening 264 formed in PC board 202. The length of transverse slot 214 exceeds the horizontal distance from the center of cylindrical tail portion 260 to the midpoint of flat 262 so that actuator 216 can rotate without placing lateral loads on support plate 200 (FIG. 7). The combination of a low-profile of the ZIF socket and vertical eccentric cam actuator 216 allows the ZIF socket of the present invention to be utilized in mobile-computing applications, where motherboard space is at a premium and component accessibility is problematic.

When flat 262 of actuator 216 is flush with the distal edge of transverse slot 214, as shown in FIG. 8, support plate 200 of the low-profile ZIF socket is engaged in the unlatched position and is ready to receive a microprocessor 266 having a plurality of pins 268. As the microprocessor is placed into the ZIF socket, pins 268 pass through the corresponding apertures 212 of support plate 200 and protrude into openings 234, housing resilient contacts 236, without engaging contact elements 242. With support plate 200 in its unlatched position, the ends of pins 268 coincide with entrance openings 240 of contacts 236, clearing elements 242.

By rotating actuator 216 half a revolution in either direction such that flat 262 is flush with the proximal edge of transverse slot 214, support plate 200 of the low-profile ZIF socket is engaged in the latched position (FIG. 9). The rotation of actuator 216 translates support plate 200 with respect to PC board 202, causing pins 268 of microprocessor 266 to expand contact elements 242 of resilient contacts 236, thereby coupling microprocessor 266 to PC board 202 and establishing an electrical connection therebetween. Conversely, to decouple microprocessor 266 from PC board 202, actuator 216 is once again rotated half a revolution to the orientation illustrated in FIG. 8, thus returning support plate 200 to its unlatched position.

Figure 10:
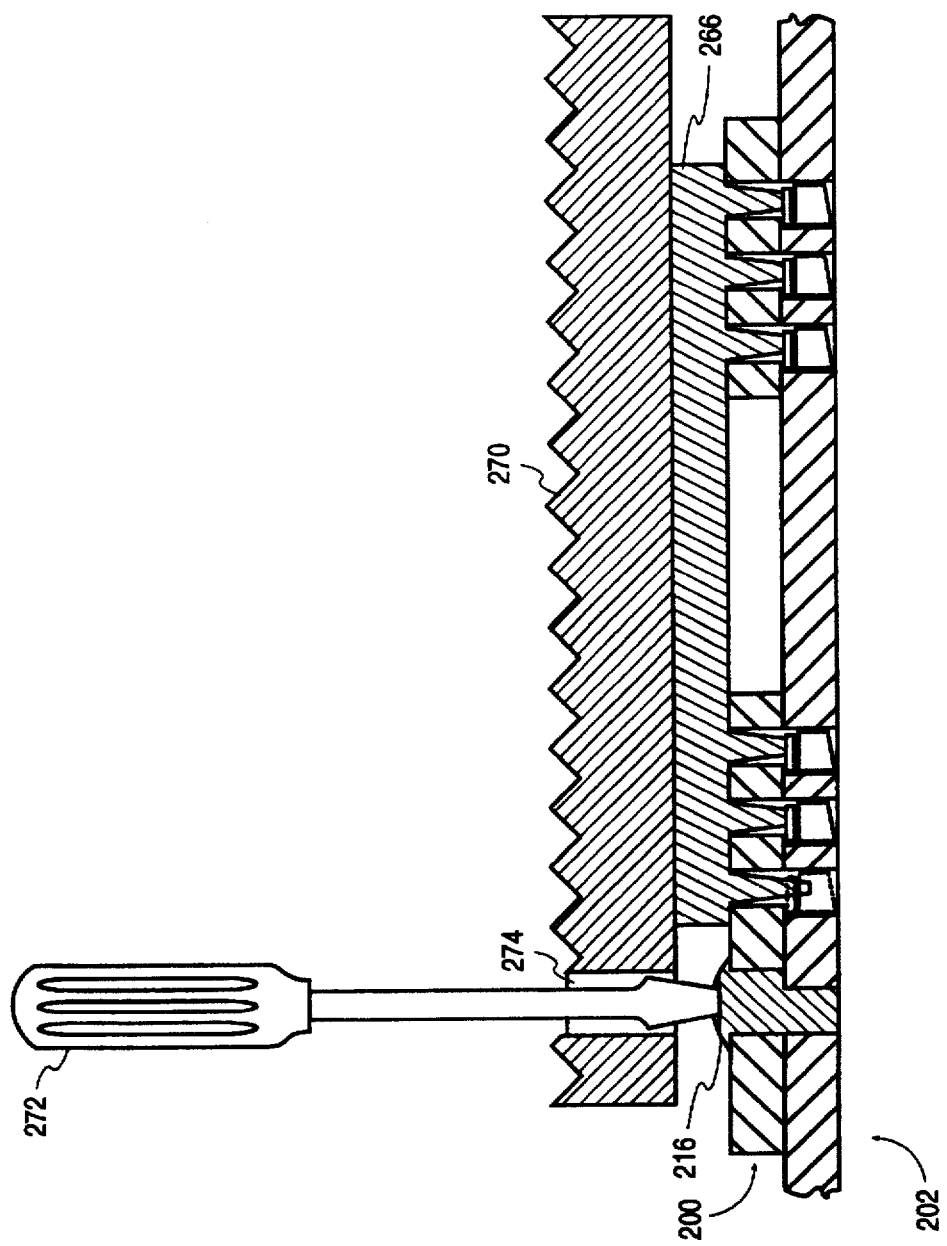
FIG. 10 is a sectional view of the low-profile ZIF socket of FIG. 2 bearing a microprocessor with an oversize heat sink.

As shown in FIG. 10, actuator 216 is easily accessible even if microprocessor 266 bears a low-profile oversize heat sink 270. When it is necessary to attach microprocessor 266 to or decouple it from PC board 202, actuator 216 can be conveniently reached by a screwdriver 272, which is inserted through an opening 274 formed in heat sink 270. Because actuator 216 is readily accessible, it is possible to utilize a variety of heat-sink geometries in order to reduce expansion-card slot loss.

Figure 11:
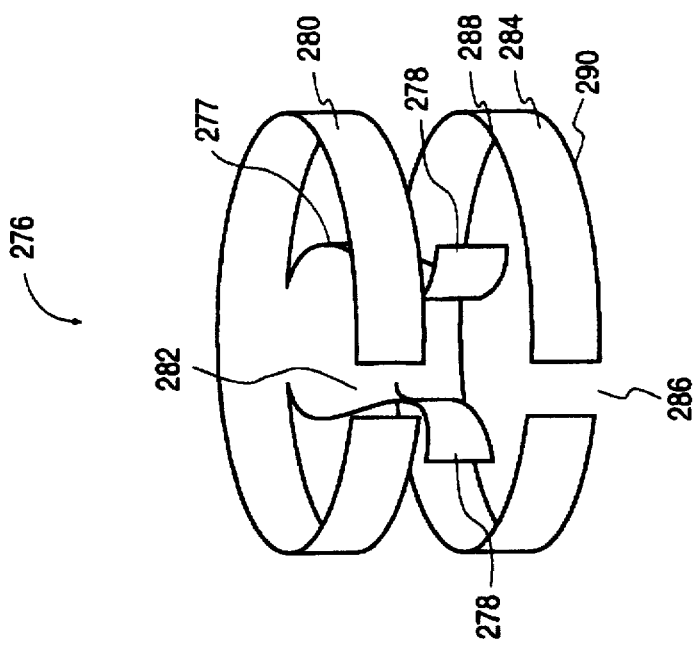
FIG. 11 is a perspective view of an alternative embodiment of a resilient contact of the low-profile ZIF socket of FIG. 2.

Many other modifications of the apparatus, some of which are described herein, are possible. For instance, the resilient contacts of the low-profile ZIF socket may have an alternative configuration illustrated in FIG. 11. Contacts 276 may comprise a head portion 277 including venturi-shaped contact elements 278, a first body portion 284, having a vertical slot 286, and a second body portion having a vertical slot 282. Head portion 277 is vertically situated between first body portion 284 and a second body portion 282. First body portion 284 includes a shoulder portion 288 and a skirt portion 290. The diameter of shoulder portion 288 is slightly greater than that of openings 234 whereas, due to the taper of first body portion 284, the diameter of skirt portion 290 is less than that of openings 234 to facilitate insertion of contacts 276 into openings 234. Contact elements 278 are gold-over-nickel plated and first and second body portions 284 and 280 are solder plated for reflow soldering to the inner surfaces of openings 234.

Figure 12:
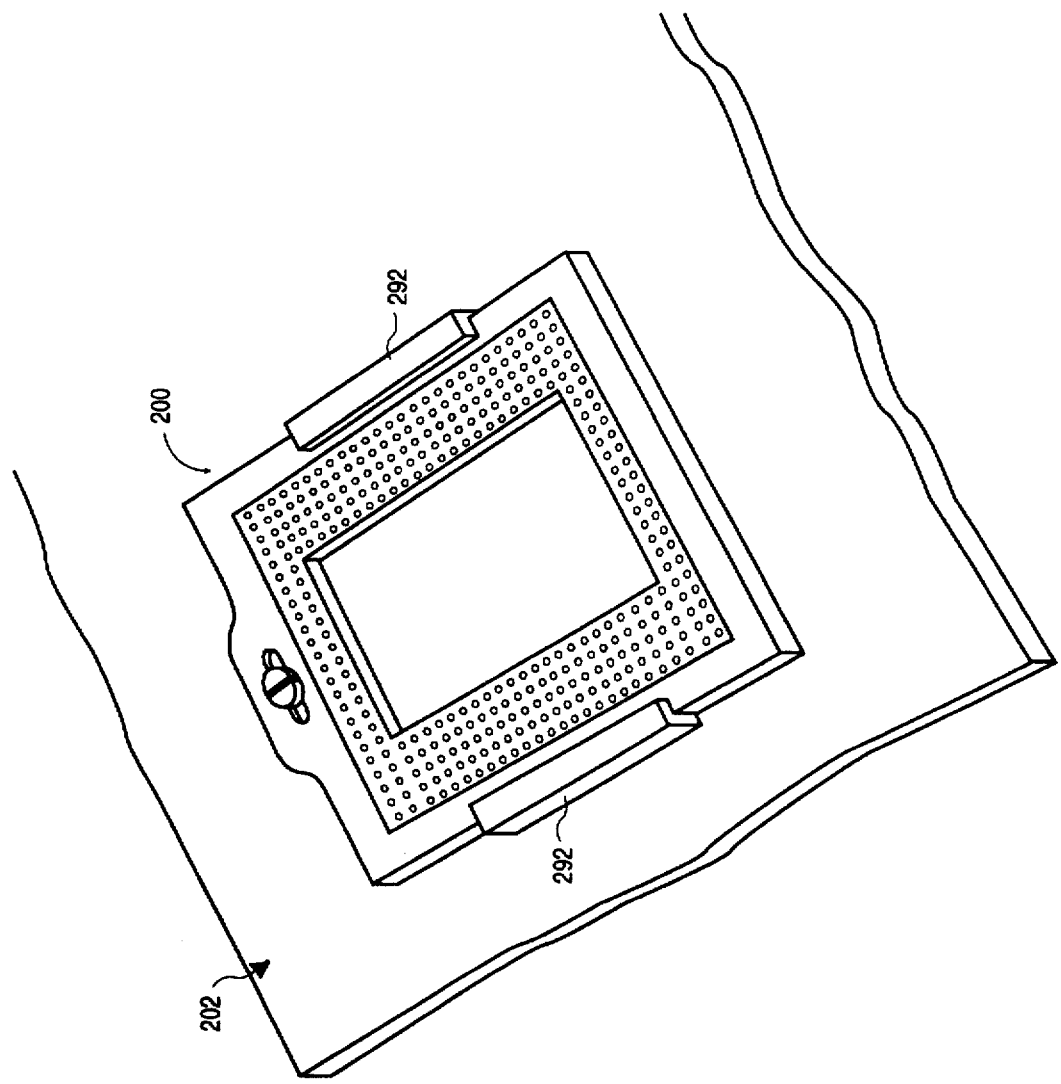
FIG. 12 is a perspective view of a low-profile ZIF socket according to an alternative embodiment of the present invention.
Figure 13:
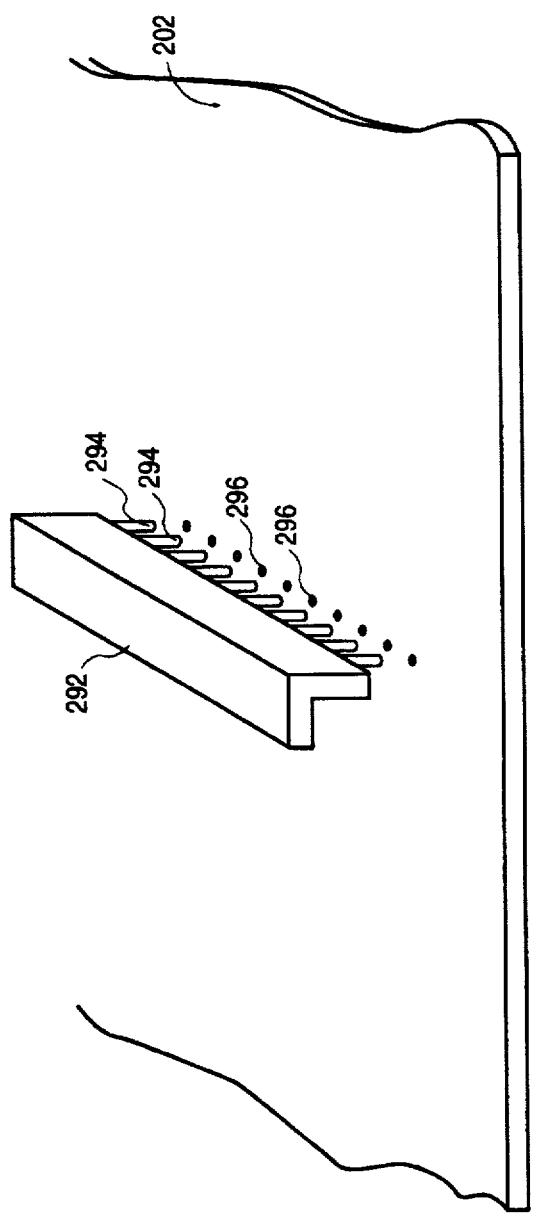
FIG. 13 is a perspective view of an L-shaped rail of the low-profile ZIF socket of FIG. 12.

Moreover, instead of utilizing snap-in fasteners, support plate 200 may be slidingly attached to PC board 202 via L-shaped rails 292 (FIG. 12). As shown in FIG. 13, each rail 292 includes a plurality of metal pins 294 soldered into a corresponding plurality of holes 296 in order to anchor rails 292 to PC board 202.

Figure 14:
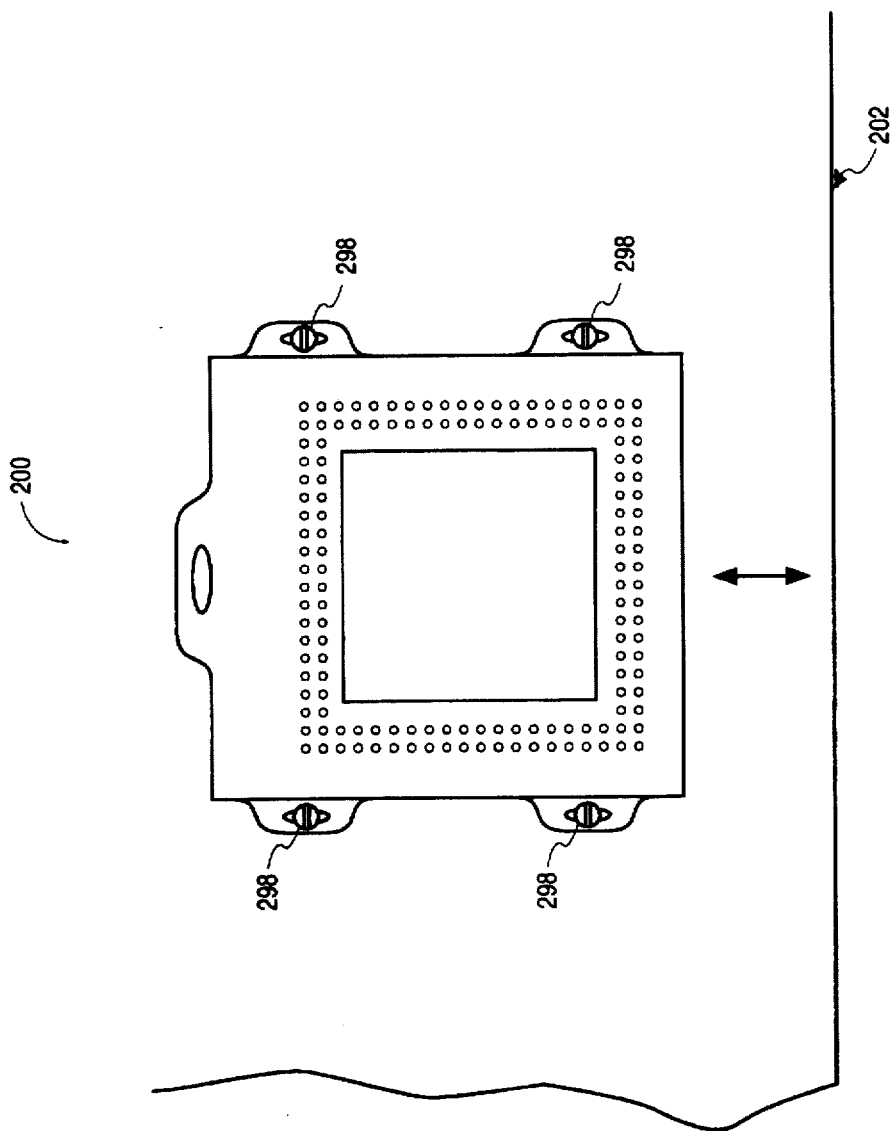
FIG. 14 is a top view of a low-profile ZIF socket having a plurality of longitudinal mounting slots.

If snap-in or other types of fasteners are utilized for attaching support plate 200 to PC board 202, a pair of longitudinal parallel slots engaging the snap-in fasteners may be replaced by a plurality of longitudinal parallel slots 298 for the purpose of slidingly anchoring support plate 200 to PC board 202 (FIG. 14).

Figure 15:
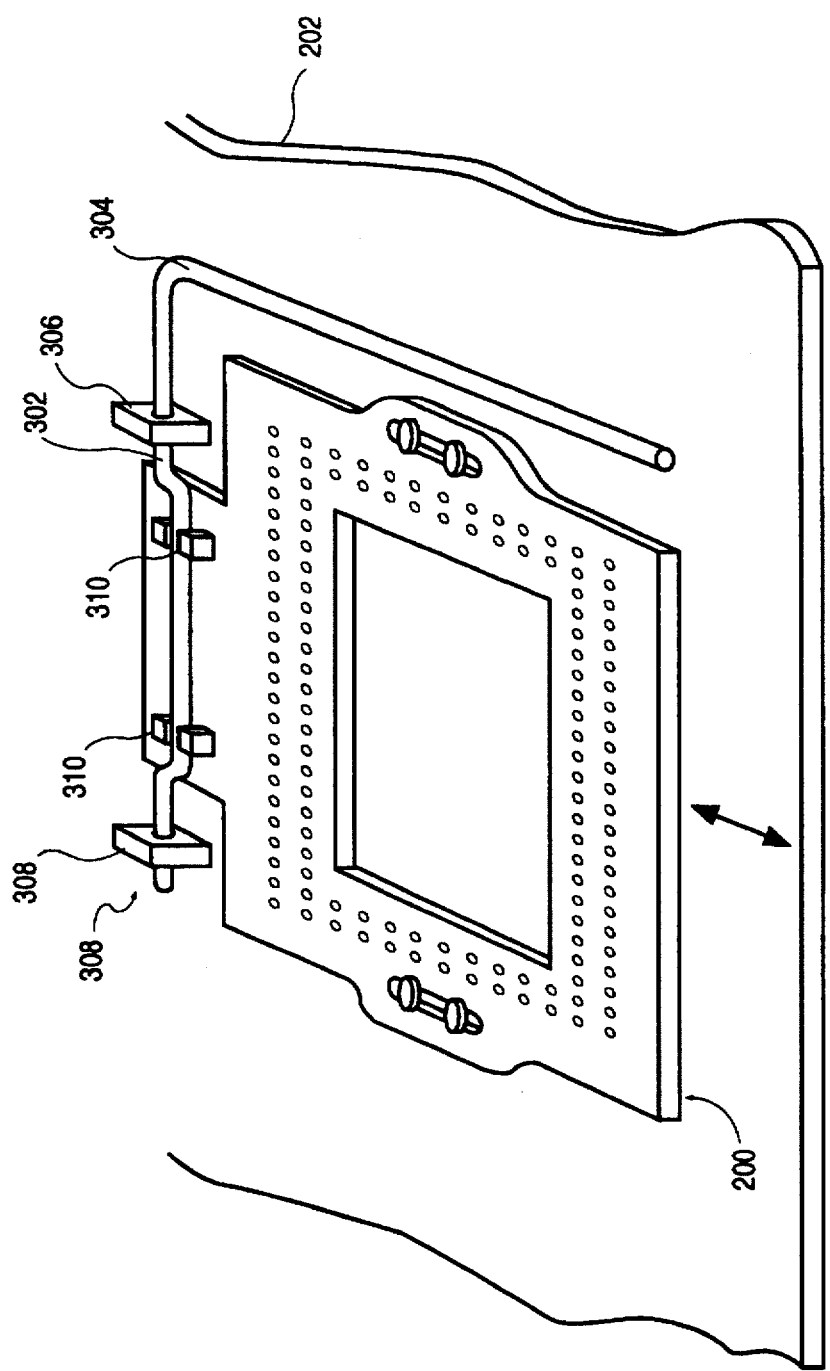
FIG. 15 is a perspective view of a low-profile ZIF socket including a horizontal cam actuator.

The low-profile ZIF socket of the invention may also utilize a horizontal cam actuator 300, as illustrated in FIG. 15. Actuator 300 includes a camshaft 302, rotatable by a lever 304 attached to the camshaft at an angle. Camshaft 302 is rotationally attached to PC board 202 by mounts 306 and 308, anchored to PC board 202 using conventional through-hole techniques. Camshaft 302 engages retaining posts 310, formed at the rear of support plate 200, such that the rotary motion of actuator 300 is translated into the fore and aft movement of support plate 200 with respect to PC board 202.

The above configurations of the integrated ZIF socket are given only as examples. Therefore, the scope of the invention should be determined not by the illustrations given, but by the appended claims and their equivalents.

What is claimed is:

1. A socket for coupling to an integrated circuit package having a plurality of terminals, said socket comprising:

a printed circuit board (PCB);

contacts disposed in a plurality of openings of said PCB for providing electrical terminal connection in said PCB;

a support plate movably attached to said PCB and disposed over said contacts to support said integrated circuit package, said support plate having a plurality of apertures, wherein said plurality of terminals extend through said apertures and into said openings; and actuation means mechanically coupled to said support plate and said PCB for moving said support plate so that said terminals engage with said contacts, thereby electrically coupling said integrated circuit package to said PCB.

2. The socket of claim 1 wherein said actuation means comprises a rotatable cam having an unlatched and a latched position, wherein rotation of said cam from said unlatched to said latched position causes a translational movement of said support plate relative to said PCB.

3. The socket of claim 2 wherein said contacts comprise a plurality of resilient contacts.

4. The socket of claim 2 wherein said support plate comprises a non-conductive plate.

5. The socket of claim 2 wherein said actuation means comprises a vertical eccentric cam rotationally coupled to said PCB and engaging said support plate, said cam having a detent that holds said cam in said unlatched and said latched positions.

6. The socket of claim 2 wherein said actuation means comprises a horizontal cam rotationally coupled to said PCB and engaging said support plate, said cam having a detent that holds said cam in said unlatched and said latched positions.

7. A socket for attaching to a semiconductor device having a plurality of terminals, said socket comprising:
   a printed circuit board (PCB);
   a plurality of resilient contacts disposed in a plurality of openings of said PCB that provide electrical connection to said PCB;
   a support plate having a plurality of apertures corresponding to said plurality of terminals, said support plate slidingly attached to said PCB, said terminals extending through said apertures and into said openings such that when said support plate is moved from a first to a second position, said terminals engage said resilient contacts to electrically couple said semiconductor device to said PCB; and
   an actuator movably engaging said support plate.

8. The socket of claim 7 wherein said actuator comprises a cam rotationally coupled to said PCB. and said support plate, said cam having an unlatched position and a latched position corresponding to said first and second positions, respectively.

9. The (zero-insertion-force) socket of claim 8 wherein said cam comprises a vertical eccentric cam)having a slotted head.

10. The (zero-insertion-force) socket of claim 9 wherein said vertical eccentric cam further includes a detent formed to engage said support plate in said first and second positions.

11. The (zero-insertion-force) socket of claim 8 wherein said cam comprises a horizontal cam.

12. The (zero-insertion-force) socket of claim 7 wherein each of said plurality of resilient contacts comprises a first cylindrical body portion having a vertical slot, and a contact head portion having an entrance opening and a pair of curvilinear contact elements.

13. The (zero-insertion-force) socket of claim 12 wherein each of said plurality of resilient contacts further comprises a second cylindrical body portion, said contact head portion being vertically oriented between said first cylindrical body portion and said second cylindrical body portion, and wherein said first cylindrical body portion includes a leading taper for insertion into said PCB.

14. A tow-profile socket for coupling to a microprocessor having a plurality of terminals, said low-profile socket comprising:
   a motherboard having a plurality of openings;
   a plurality of resilient contacts disposed in said openings of said motherboard;
   a non-conductive support plate movably attached to said motherboard, said non-conductive support plate including a plurality of through apertures formed to receive said plurality of terminals such that said terminals extend through said apertures into said openings, said non-conductive support plate having an unlatched and a latched position, said resilient contacts being electrically disengaged from said plurality of terminals in said unlatched position, and said resilient contacts being electrically engaged with said plurality of terminals in said latched position; and
   an actuator for moving said non-conductive support plate into said latched position.

15. The low-profile socket of claim 14 wherein said actuator comprises a vertical eccentric cam including a slotted head, a cylindrical body portion concentric with said slotted head, and a cylindrical tail portion eccentric to said cylindrical body portion, said cylindrical body portion engaging a drive slot formed in said support plate, said cylindrical tail portion rotationally coupled to said motherboard via a cylindrical opening in said motherboard.

16. The low-profile socket of claim 15 wherein said drive slot is formed to allow lateral movement of said vertical eccentric cam without laterally loading said supporting plate.

17. The low-profile socket of claim 15 wherein said vertical eccentric cam further includes a flat detent formed on said cylindrical body portion, said flat detent alternatively engaging said support plate in said unlatched and said latched positions.

18. The low-profile socket of claim 14 wherein said actuator comprises a horizontal cam attached to said motherboard.

19. A method of electrically connecting an integrated circuit package having a plurality of pins to a printed circuit board (PCB) comprising the steps of:
   (a) inserting a plurality of contact members into a corresponding plurality of openings in said PCB, an inner surface of said openings having a soldered connection to an electrical trace on said PCB, each of said contact members abutting in said soldered connection and also having at least one curvilinear member that accepts one of said pins;
   (b) mounting a support plate to said PCB such that said support plate slidingly moves over said opening upon rotation of a cam, said support plate having a plurality of through apertures that accept said pins;
   (c) placing said package onto said support plate such that said pins extend through said apertures into said openings while said support plate is in a first position;
   (d) rotating said cam from said first position to a second position thereby causing said pins to electrically engage said at least one curvilinear member of said contact members.

20. The method of claim 19 further comprising the step, performed after step (a), of:
   reflow soldering each of said contact members to said soldered connection.

21. The method of claim 19 wherein said cam comprises a vertical eccentric cam including a slotted head, a cylindrical body portion disposed in said support plate concentric with said slotted head, and a cylindrical tail portion disposed in said PCB eccentric to said cylindrical body portion, said cylindrical body portion having a detent that engages said vertical eccentric cam in said first and second positions, and wherein step (d) comprises the step of:
   placing a flat-headed tool into said slotted head;
   rotating said tool by 180 degrees such that said detent is disengaged from said first position, and engaged in said second position.

22. A socket for attaching to a semiconductor device having a plurality of terminals, said socket comprising:
   a printed circuit board (PCB);
   a plurality of resilient contacts disposed in a plurality of openings of said PCB that provide electrical connection to said PCB, each of said plurality of resilient contacts comprising a first cylindrical body portion having a vertical slot, a second cylindrical body portion and a contact head portion vertically oriented between said first and second cylindrical body portions, said contact head having an entrance opening and a pair of curvilinear contact elements, said first cylindrical body portion includes a leading taper for insertion into said PCB; and a support plate having a plurality of apertures corresponding to said plurality of terminals slidingly attached to said PCB, said terminals extending through said apertures and into said openings such that when said support plate is moved by an actuator from a first to a second position, said terminals engage said resilient contacts to electrically couple said semiconductor device to said PCB.

23. The socket of claim 22 wherein said actuator comprises a cam rotationally coupled to said PCB and said support plate, said cam having an unlatched position and a latched position corresponding to said first and second positions, respectively.

24. The socket of claim 23 wherein said cam comprises a vertical eccentric cam having a slotted head.

25. The socket of claim 24 wherein said vertical eccentric cam further includes a detent formed to engage said support plate in said first and second positions.

26. The socket of claim 23 wherein said cam comprises a horizontal cam.

* * * * *

UNITED STATES PATENT AND TRADEMARK OFFICE
CERTIFICATE OF CORRECTION

PATENT NO. : 5,707,247
DATED : January 13, 1998
INVENTOR(S) : Rolf A. Konstad

It is certified that error appears in the above-indentified patent and that said Letters Patent is hereby corrected as shown below:

In column 4 at line 45 delete "fellow" and insert --reflow--

Signed and Sealed this

Twenty-first Day of July, 1998

Attest:

BRUCE LEHMAN

*Attesting Officer*      *Commissioner of Patents and Trademarks*